(12) United States Patent
Morimoto

(10) Patent No.: US 8,816,183 B2
(45) Date of Patent: Aug. 26, 2014

(54) THERMOELECTRIC MODULE AND OPTICAL TRANSMISSION APPARATUS

(75) Inventor: Akihiro Morimoto, Toyota (JP)

(73) Assignee: Aisin Seiki Kabushiki Kaisha, Kariya-shi (JP)

( * ) Notice: Subject to any disclaimer, the term of this patent is extended or adjusted under 35 U.S.C. 154(b) by 1314 days.

(21) Appl. No.: 12/116,465

(22) Filed: May 7, 2008

(65) Prior Publication Data

US 2008/0276624 A1 Nov. 13, 2008

(30) Foreign Application Priority Data

May 10, 2007 (JP) ................................ 2007-125777

(51) Int. Cl.
| | |
|---|---|
| *H01L 35/32* | (2006.01) |
| *H01S 5/024* | (2006.01) |
| *F25B 21/02* | (2006.01) |
| *H01L 35/28* | (2006.01) |
| *H01L 35/30* | (2006.01) |
| *H01S 5/022* | (2006.01) |

(52) U.S. Cl.
CPC ............... *F25B 21/02* (2013.01); *H01L 35/32* (2013.01); *H01S 5/02212* (2013.01); *H01L 2924/19107* (2013.01); *H01S 5/024* (2013.01); *H01L 35/28* (2013.01); *H01L 35/30* (2013.01); *H01S 5/02415* (2013.01); *H01S 5/02407* (2013.01); *H01L 2224/48091* (2013.01)
USPC ............. 136/204; 136/203; 136/230; 372/34; 372/36

(58) Field of Classification Search
CPC ... H01S 5/024; H01S 5/02415; H01S 5/0247; G02B 6/4202; G02B 6/42; H01L 35/28; H01L 35/30; H01L 35/32; F25B 21/02
USPC ............... 136/200, 203, 204, 230; 372/34, 36
See application file for complete search history.

(56) References Cited

U.S. PATENT DOCUMENTS

| | | | |
|---|---|---|---|
| 7,200,294 B2 | 4/2007 | Uchida | |
| 7,342,257 B2 | 3/2008 | Oomori | |
| 2005/0000558 A1* | 1/2005 | Moriyama et al. | ............ 136/205 |
| 2007/0028955 A1* | 2/2007 | Sogou et al. | .................. 136/200 |

FOREIGN PATENT DOCUMENTS

| | | | | |
|---|---|---|---|---|
| JP | 05-256693 A | * 10/1993 | ................ G01J 1/02 |
| JP | 2001-59276 | 3/2001 | | |

(Continued)

OTHER PUBLICATIONS

JP05-256693A, Machine Translation, Hirota, Oct. 1993.*

(Continued)

*Primary Examiner* — Devina Pillay
(74) *Attorney, Agent, or Firm* — Oblon, Spivak, McClelland, Maier & Neustadt, L.L.P.

(57) ABSTRACT

A thermoelectric module includes a first insulated substrate having a first opposing surface, a second insulated substrate having a second opposing surface, the second opposing surface faces the first opposing surface, a plurality of electrodes formed on the first and second opposing surfaces, a plurality of thermoelectric transducers provided between the first insulated substrate and the second insulated substrate, the plurality of thermoelectric transducers electrically connected with one another in series and/or in parallel via each electrode, and a conducting circuit electrically connecting the plurality of electrodes with an external power source, wherein the first insulated substrate includes a substrate body having the first opposing surface and a projecting portion being formed continuously from the substrate body and extending in a direction that intersects the substrate body, and the projecting portion includes a fixing surface extending in the direction that intersects the substrate body.

5 Claims, 9 Drawing Sheets

(56) References Cited

FOREIGN PATENT DOCUMENTS

| JP | 2004-253779 | | 9/2004 | |
|----|-------------|---|--------|---|
| JP | 2004-303750 | | 10/2004 | |
| JP | 2004-312991 | | 11/2004 | |
| KR | 10-0326038 | * | 2/2002 | ............... H01S 5/30 |

OTHER PUBLICATIONS

KR10-0326038, Machine Translation, Lee, Feb. 2002.*
Office Action issued Oct. 4, 2011 in Japanese Patent Application No. 2007-125777 (with English translation).

* cited by examiner

F I G. 4
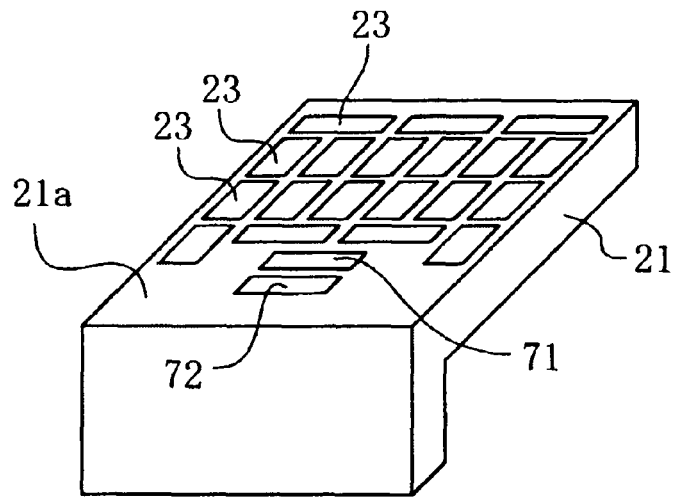
F I G. 5
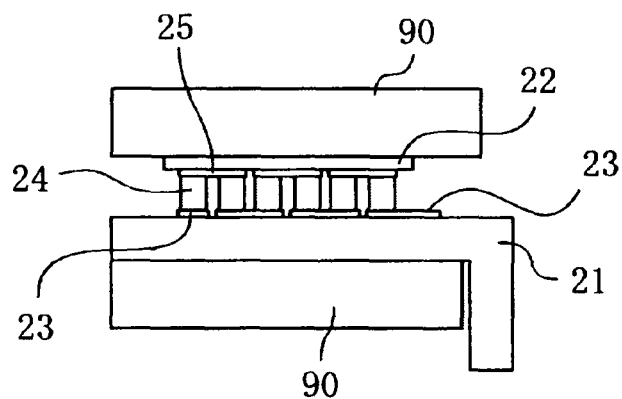
F I G. 6
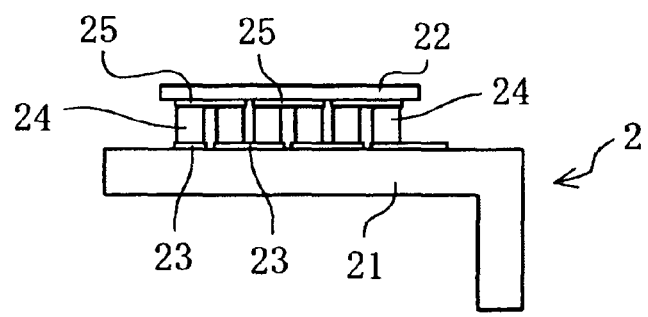

THERMOELECTRIC MODULE AND OPTICAL TRANSMISSION APPARATUS

CROSS REFERENCE TO RELATED APPLICATIONS

This application is based on and claims priority under 35 U.S.C §119 with respect to Japanese Patent Application 2007-125777, filed on May 10, 2007, the entire content of which is incorporated herein by reference.

FIELD OF THE INVENTION

This invention relates to a module having thermoelectric transducers and an optical transmission apparatus having this kind of thermoelectric module.

BACKGROUND

Various kinds of thermoelectric modules, each having thermoelectric transducers, are known. The thermoelectric module cools and/or heats various kinds of apparatus by means of the thermoelectric transducers (so called peltier elements). For example, an optical transmission apparatus having the thermoelectric module is disclosed in JP 2004-253779A. The optical transmission apparatus disclosed in JP 2004-253779A cools a laser diode of an optical transmission module by thermoelectric transducers of the thermoelectric module. FIG. 18 is an explanation drawing schematically showing the known thermoelectric module and the optical transmission apparatus. Hereinafter, referring to FIG. 18, the known thermoelectric module and the optical transmission apparatus will be described.

A known optical transmission apparatus 100 shown in FIG. 18 includes a thermoelectric module 102, an optical transmission device 104, and a retaining member 103. The retaining member 103, formed in a box shape, retains the thermoelectric module 102 and the optical transmission device 104 therein. More specifically, the thermoelectric module 102 includes a first insulated substrate 120, a second insulated substrate 121, electrodes (not shown), and thermoelectric transducers 123.

The first insulated substrate 120 is firmly fixed at a bottom wall 124 of the retaining member 103 by means of adhering or soldering. Multiple electrodes (not shown) are formed on an upper surface of the first insulating substrate 120. The second insulated substrate 121 faces the first insulated substrate 120. Multiple electrodes (not shown) are formed on a lower surface of the second insulated substrate 121. Multiple thermoelectric transducers 123 are interposed between the second insulated substrate 121 and the first insulated substrate 120. Each thermoelectric transducer 123 is electrically connected to the corresponding electrode formed on the first insulated substrate 120, and also is connected with the corresponding electrode formed on the second insulated substrate 121. Further, a photodiode 125, comprising the optical transmission device 104, is disposed at the upper surface of the first insulated substrate 120. A laser diode 126, comprising the optical transmission device 104, is disposed at the upper surface of the second insulated substrate 121. When each thermoelectric transducer 123 is energized, a temperature of one surface of the thermoelectric transducer 123 rises and a temperature of another surface of the thermoelectric transducer 123 falls. The direction of the energization determines which side of the surface rises or falls the temperature. In the thermoelectric transducers 123 shown in FIG. 18, the temperature falls on a surface at the side of the second insulated substrate 121 and rises on a surface at the side of the first insulated substrate 120. Hence, the thermoelectric transducers 123 shown in FIG. 18 cool the laser diode 126 on the second insulated surface 121. The surface of each thermoelectric transducer 123, which rises the temperature, is fixed to the first insulated substrate 120. Thus, heat generated at the thermoelectric transducer 123 is dissipated to an exterior of the retaining member 103 through the first insulated substrate 120 and the bottom wall 124.

Generally, the thermoelectric module 102 is disposed at a limited space. For example, in the known optical transmission apparatus 100 shown in FIG. 18, the first and second insulated substrates 120 and 121 are respectively arranged in a manner that a surface, having larger area, is oriented to the bottom wall 124 of the retaining member 103. Hence, the number of the thermoelectric transducers 123, which are disposed on the first insulated substrate 120, is determined depending on an overall diameter of the bottom wall 124. Generally, the overall diameter of the bottom wall 124 in the optical transmission apparatus 100 is approximately 5 mm and is relatively small. Hence, a region of the first insulated substrate 120, on which the thermoelectric transducers 123 are disposed, is small and is not able to accommodate many thermoelectric transducers 123. Further, in the known optical transmission apparatus 100 shown in FIG. 18, the photodiode 125 is disposed on the first insulated substrate 120 as well as the thermoelectric transducers 123. Thus, the region of the first insulated substrate 120, on which the thermoelectric transducers 123 are disposed, is further limited. When a small number of the thermoelectric transducers 123 are disposed in the thermoelectric module 102, the heat exchange ability thereof is small. Accordingly, when a heat value of the laser diode 126 is large, the thermoelectric module 102 may be unable to cool the laser diode 126 by means of the thermoelectric module 102 effectively.

A need exists for a thermoelectric module which is not susceptible to the drawback mentioned above.

SUMMARY OF THE INVENTION

According to a first aspect of the present invention, a thermoelectric module includes a first insulated substrate having a first opposing surface, a second insulated substrate having a second opposing surface, the second opposing surface faces the first opposing surface, a plurality of electrodes formed on the first and second opposing surfaces, a plurality of thermoelectric transducers provided between the first insulated substrate and the second insulated substrate, the plurality of thermoelectric transducers electrically connected with one another in series and/or in parallel via each electrode, and a conducting circuit electrically connecting the plurality of electrodes with an external power source, wherein the first insulated substrate includes a substrate body having the first opposing surface and a projecting portion being formed continuously from the substrate body and extending in a direction that intersects the substrate body, and the projecting portion includes a fixing surface extending in the direction that intersects the substrate body.

According to a second aspect of the present invention, a thermoelectric module includes a first insulated substrate having a first opposing surface, a second insulated substrate having a second opposing surface, the second opposing surface faces the first opposing surface, a plurality of electrodes formed at the first and second opposing surfaces, a plurality of thermoelectric transducers provided between the first insulated substrate and the second insulated substrate, the plurality of thermoelectric transducers electrically connected with one another in series and/or in parallel by each electrode, and a conducting circuit electrically connecting the plurality of electrodes with an external power source, wherein the first insulated substrate includes a fixing surface extending in a direction that intersects the first opposing surface and a part of the conducting circuit is formed inside the first insulated substrate.

According to a third aspect of the present invention, a thermoelectric module includes a first insulated substrate having a first opposing surface, a second insulated substrate having a second opposing surface, the second opposing surface faces the first opposing surface, a plurality of electrodes formed at the first and second opposing surfaces, a plurality of thermoelectric transducers provided between the first insulated substrate and the second insulated substrate, the plurality of thermoelectric transducers electrically connected with one another in serial and/or in parallel via each electrode, and a conducting circuit electrically connecting the plurality of electrodes with an external power source, wherein the first insulated substrate includes a fixing surface extending in a direction that intersects the first opposing surface.

BRIEF DESCRIPTION OF THE DRAWINGS

The foregoing and additional features and characteristics of the present invention will become more apparent from the following detailed description considered with reference to the accompanying drawings, wherein:

FIG. 4 is an explanation diagram schematically showing the manufacturing process of the thermoelectric module according to the first embodiment;

FIG. 5 is an explanation diagram schematically showing the manufacturing process of the thermoelectric module according to the first embodiment;

FIG. 6 is an explanation diagram schematically showing the manufacturing process of the thermoelectric module according to the first embodiment;

DETAILED DESCRIPTION

Figure 1:
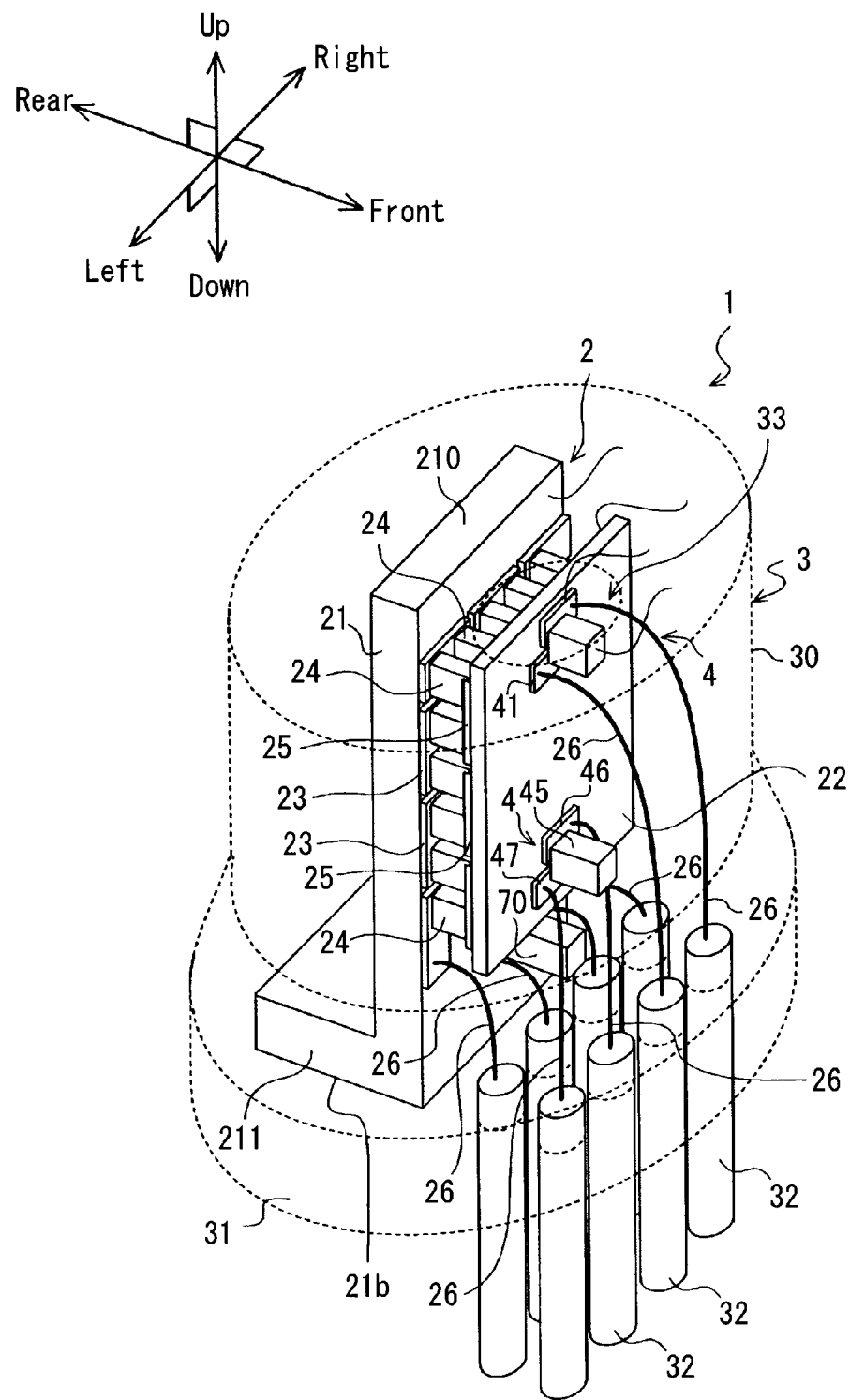
FIG. 1 is a perspective view schematically showing an optical transmission apparatus according to a first embodiment.

A thermoelectric module of a first embodiment of the invention is suitably used for an optical transmission apparatus. However, the thermoelectric module may be disposed at other apparatuses. For example, when the thermoelectric module of the first embodiment of the invention is disposed at an image pick-up apparatus, an imaging sensor such as a CCD imager is cooled by means of the thermoelectric transducers. Alternatively, when the thermoelectric module of the first embodiment is disposed at a thermal refrigerator, the refrigerator inside is cooled or warmed by means of the thermoelectric transducers.

A first and second insulated substrates in the thermoelectric module may be comprised of at least one kind of insulating material, which is selected from Aluminum oxide ($Al_2O_3$), Aluminum Nitride (AlN), Silicon nitride (SiN), and the like. Alternatively, the thermoelectric module may be comprised of at least one kind of metal material, i.e. non-insulated material, which is selected from Copper, Aluminum, Copper/tungsten base alloy and the like, and the aforementioned insulating material. For example, a surface of a body layer made up of the aforementioned metal material may be covered with an insulating layer made up of the aforementioned insulating material. In this case, the body and insulating layers may be formed by a single layer or more layers.

A conducting circuit may be patterned at least one of the first and second insulated substrates. Alternatively, the conducting circuit may be formed separately from the first and second insulated substrates by bonding wires and the like. The conducting circuit may be directly connected to an external power source or may be connected to the lead terminals connected to the external power source and the like.

It is desired that the second insulated substrate is thinner than the first insulated substrate. Thickness of the entire thermoelectric module may be reduced by designing the second insulated substrate so as to be thinner than the first insulated substrate. So configured, the thermoelectric module may be disposed at a smaller space.

Further, elemental devices, which are other than the thermoelectric transducer, may be disposed at least one of the first and second insulated substrates of the thermoelectric module. For instance, a light emitting element or a CCD imager may be disposed. In this case, electrodes for the elemental devices or conducting circuits for the elemental devices (hereinafter, referred to as sub conducting circuit) may be formed on the substrate, on which the elemental devices other than the thermoelectric transducer are disposed. As with the conducting circuit connecting the electrodes for the thermoelectric transducer and the external power source, a part of the sub conducting circuit may be formed inside the substrate on which the elemental devices other than the thermoelectric transducer are disposed.

(Embodiment) Hereinafter, a thermoelectric module and an optical transmission apparatus according to a first embodiment will be described with reference to the drawings.

(First Embodiment)

Figure 2:
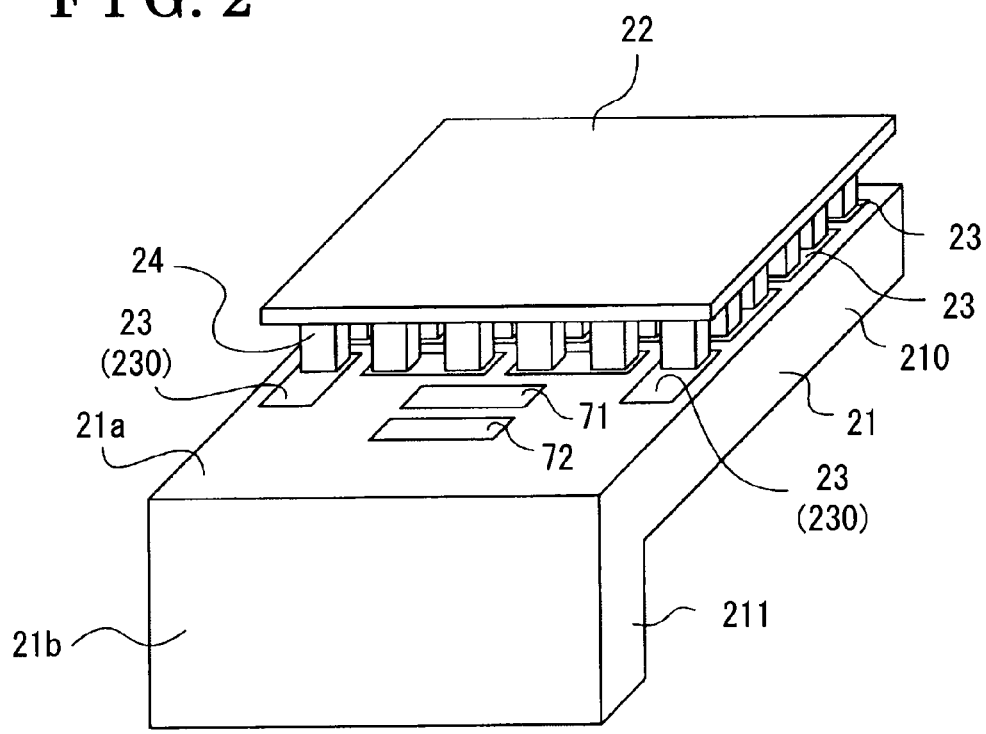
FIG. 2 is a perspective view schematically showing a thermoelectric module according to the first embodiment.

A thermoelectric module of the first embodiment is one example of a first thermoelectric module described later. Further, an optical transmission apparatus of the first embodiment is one example of the optical transmission apparatus that the invention is applied. FIG. 1 is a perspective view schematically showing the optical transmission apparatus of the first embodiment. In FIG. 1, the retaining member is indicated by a broken line. FIG. 2 is a perspective view schematically showing the thermoelectric module of the first embodiment. FIGS. 3 to 6 are explanation drawings schematically showing manufacturing process of the thermoelectric module of the first embodiment. Hereinafter, in the first embodiment, up, down, left, right, front, and rear indicate up, down, left, right, front, and rear shown in FIG. 1. Further, a width direction indicates a left-and-right direction in FIG. 1, and a longitudinal direction indicates an up-and-down direction in FIG. 1. Furthermore, a thickness direction indicates a front-and-rear direction in FIG. 1.

The optical transmission apparatus 1 according to the embodiment 1 includes a thermoelectric module 2, a retaining member 3, and an optical transmission device 4.

The retaining member 3 is made up of stainless steel and forms a box shape as shown in FIG. 1. More specifically, the retaining member 3 includes a cylindrical cover 30 having a bottom and a substantially discoid bottom wall 31. Multiple lead terminals 32 are inserted into the bottom wall 31. A lower end portion of each lead terminal 32 is electrically connected with an external power source (not shown). The bottom wall 31 and the cover 30 respectively have an engaging portion (not shown) and the engaging portions are engaged with each other for integrating the bottom wall 31 and the cover 30. A diameter of an upper portion of the cover 30 is smaller than that of a lower portion of the cover 30. A lens 33 is formed at an upper wall of the cover 30.

As shown in FIGS. 1 and 2, the thermoelectric module 2 includes a first insulated substrate 21, a second insulated substrate 22, multiple electrodes for the thermoelectric transducer 23 and 25, multiple thermoelectric transducers 24, and a conducting circuit.

The first insulated substrate 21 is made up of Aluminum oxide and a cross section thereof forms a substantially L shape. The first insulated substrate 21 includes a substrate body 210 and a projecting portion 211. The substrate body 210 forms an elongated shape. When viewed in a longitudinal direction of the substrate body 210, the projecting portion 211 is continuously formed from one end portion of the substrate body 210. The projecting portion extends in a direction that intersects the substrate body 210 at a right angle, i.e. a direction parallel to thickness of the substrate body 210. A group of first electrodes for the thermoelectric transducer 23 are formed at a front surface of the substrate body 210. Each first electrode for the thermoelectric transducer 23 is made up of Copper and is plated on the front surface of the substrate body 210. A front surface 21a of the first insulated substrate 21 in the thermoelectric module 2 of the first embodiment corresponds to a first opposing surface in the thermoelectric module of the invention. A lower surface 21b of the projecting portion 211 is soldered on the bottom wall 31 of the retaining member 3. The lower surface 21b of the projecting portion 211 intersects the first opposing surface 21a at the right angle. The lower surface 21b of the projecting portion 211 in the thermoelectric module 2 of the first embodiment corresponds to a fixing surface of the thermoelectric module of the invention.

The second insulted substrate 22 is made up of Aluminum oxide and is a sheet form which is thinner than the first insulated substrate 21. A group of second electrodes for the thermoelectric transducer 25 are formed at a rear surface 22c of the second insulated surface 22. Each second electrode for the thermoelectric transducer 25 is made up of Copper and is plated on the rear surface 22c of the second insulated substrate 22. The rear surface 22c of the second insulated substrate 22 in the thermoelectric module 2 of the first embodiment corresponds to a second opposing surface in the thermoelectric module of the invention. The first insulated substrate 21 and the second insulated substrate 22 are arranged in a manner that the first opposing surface 21a faces the second opposing surface 22c. The multiple thermoelectric transducers 24 are provided between the first opposing surface 21a and the second opposing surface 22c. Each thermoelectric transducer 24 is formed by a peltier element. A first surface of each thermoelectric transducer 24 is electrically connected with the corresponding first electrode for the thermoelectric transducer 23, and a second surface of each thermoelectric transducer 24 is electrically connected with the corresponding second electrode for the thermoelectric transducer 25. The thermoelectric transducers 24 are connected with one another in series via the first and second electrodes for the thermoelectric transducer 23 and 25. The electrodes for the thermoelectric transducer 230 connect with the two thermoelectric transducers 24, each located at an end with respect to a direction of alignment thereof, and also respectively connect with the corresponding lead terminal 32 via each bonding wire 26. The bonding wires 26 correspond to a conducting circuit in the thermoelectric module of the invention.

As shown in FIG. 1, the optical transmission device 4 includes a light emitting element 40, two electrodes for the light emitting element 41 and 42, a first sub conducting circuit, a light receiving element 45, two electrodes for the light receiving element 46 and 47, a second sub conductive circuit. The first sub conducting circuit electrically connects each electrode for the light emitting element 41, 42 with the external power source, and the second sub conducting circuit electrically connects each electrode for the light receiving element 46, 47 with the external power source.

The light emitting element 40 is comprised of a laser diode. The electrodes for the light emitting element 41 and 42 are made up of copper and are plated on a front surface of the second insulated substrate 22. The light emitting element 40 is electrically connected with the two electrodes for the light emitting element 41 and 42. The electrodes for the light emitting element 41 and 42 are respectively connected with the corresponding lead terminal 32 via each bonding wire 26. The bonding wires 26 comprise the first sub conducting circuit.

The light receiving element 45 is comprised of a photodiode. The light receiving element 45 receives a part of light transmitted from the light emitting element 40 to monitor the operation of the light emitting element 40. The electrodes for the light emitting element 46 and 47 are made up of copper and are plated on the front surface of the second insulated substrate 22. The light receiving element 45 is electrically connected with the electrodes for the light receiving element 46 and 47. The electrodes for the light emitting element 46 and 47 are respectively connected with the corresponding lead terminal 32 via each bonding wire 26. The bonding wires 26 comprise the second sub-conducting circuit.

Further, an IC 70 is disposed at the thermoelectric module of the first embodiment. More specifically, as shown in FIG. 4, two electrodes for IC 71 and 72 are plated on the first opposing surface 21a of the first insulated substrate 21. IC 70 is electrically connected with the two electrodes for IC 71 and 72. The electrodes for IC 71 and 72 are respectively connected with the corresponding lead terminal 32 via each bonding wire 26. The bonding wires 26 comprise a third sub conducting circuit.

When energizing the thermoelectric transducers 24 in the thermoelectric module 2 of the first embodiment, the temperature rises on the first surface of each thermoelectric transducer 24 and falls on the second surface thereof. Hence, the thermoelectric transducers 24 cool the light emitting element 40 on the second insulated substrate 22 described later. The heat generated on each first surface is dissipated to an exterior of the retaining member 3 via the first insulated substrate 21 and the bottom wall 31.

Manufacturing process of the thermoelectric module 2 of the first embodiment will be described below.

(Substrate Forming Process)

Figure 3:
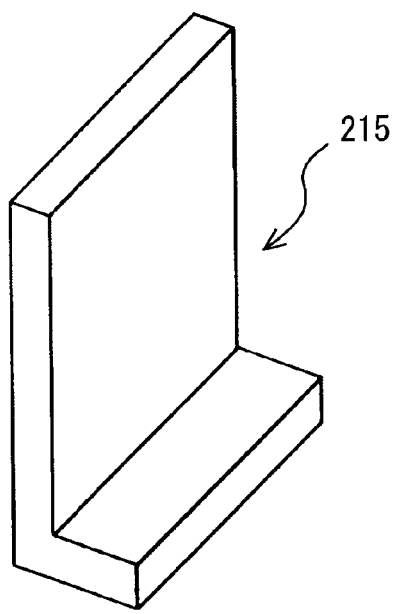
FIG. 3 is an explanation diagram schematically showing manufacturing process of a thermoelectric module according to the first embodiment.

As shown in FIG. 3, a first insulated substrate intermediate form 215 is molded by using slurry Aluminum oxide based mixed materials. A cross section of the first insulated substrate intermediate form 215 is formed in a substantially L shape. The first insulated substrate intermediate form 215 is baked to obtain the first insulated substrate 21. Similarly, a second insulated substrate intermediate form (not shown) is molded by using the slurry Aluminum oxide based mixed materials. The second insulated substrate intermediate form is baked to obtain the second insulated substrate 22.

(Electrode Forming Process)

As shown in FIG. 4, the group of first electrodes for the thermoelectric transducer 23 and the electrodes for IC 71 and 72 are plated on the front surface of the first insulated substrate 21 obtained at the substrate forming process, i.e. the first opposing surface 21a. Similarly, the group of second electrodes for the thermoelectric transducer 25 is plated on the rear surface of the second insulated substrate 22, i.e. the second opposing surface 22c. Further, the electrodes for the light emitting element 41 and 42, and the electrodes for the light receiving element 46 and 47 are plated on the front surface of the second insulated substrate 22.

(Integration Process)

A solder (not shown) is sandwiched between each first electrode for the thermoelectric transducer 23 formed on the first insulated substrate 21 and the first surface of each thermoelectric transducer 24. Further, a solder (not shown) is sandwiched between each second electrode for the thermoelectric transducer 25 formed on the second insulated substrate 22 and the second surface for each thermoelectric transducer 24. As shown in FIG. 5, a heater plate 90 is pressed to the rear surface of the first insulated substrate 21, and another heat plate 90 is pressed to the front surface of the second insulated substrate 22 to thermally melt the solders. In the process, each first electrode for the thermoelectric transducer 23 formed at the first insulated substrate 21 is soldered to the corresponding first surface of each thermoelectric transducer 24, and each second electrode for the thermoelectric transducer 25 formed on the second insulated substrate 22 is soldered to the corresponding second surface of each thermoelectric transducer 24. The thermoelectric module 2 of the first embodiment shown in FIG. 6 is obtained.

The first insulated substrate 21 in the thermoelectric module 2 of the first embodiment has the fixing surface 21b extending in the direction that intersects the first opposing surface 21a. The fixing surface 21b is fixed on the bottom wall 31 of the remaining member 3. Consequently, the first opposing surface 21a is arranged in a manner that a longitudinal direction thereof is along the up-and-down direction. Hence, the first opposing surface 21a may be formed larger than the bottom wall 31. Thus, the thermoelectric module 2 of the first embodiment may be disposed in the limited space, and the greater number of the thermoelectric transducers 24 may be disposed. Therefore, the thermoelectric module 2 of the first embodiment has the excellent heat exchange ability. Further, the optical transmission apparatus 1 of the first embodiment effectively cools the light emitting element 40 by means of the thermoelectric module 2.

The fixing surface 21b is formed in the projecting portion 211. Thus, even if the thickness of the first insulated substrate 21 is reduced, the thermoelectric module 2 of the first embodiment is still able to have the large fixing surface 21b. Since the fixing surface 21b is large, the thermoelectric module 2 of the first embodiment effectively transmits the heat generated in the thermoelectric transducers 24 to the retaining member 3. Therefore, the optical transmission apparatus 1 of the first embodiment effectively cools the light emitting element 40 by means of the thermoelectric module 2. Further, since the fixing surface 21b is large, the thermoelectric module 2 is securely fixed to the retaining member 3.

Furthermore, the fixing surface 21b of the projecting portion 211 is directly soldered to the bottom wall 31. Consequently, the heat generated in the thermoelectric transducers 24 is effectively dissipated to the exterior of the optical transmission apparatus 1 via the first insulated substrate 21 and the bottom wall 31. Therefore, the optical transmission apparatus 1 of the first embodiment effectively cools the light emitting element 40 by means of the thermoelectric module 2, compared to the configuration that the first insulated substrate 21 is soldered to the bottom wall 31 via another member.

The upper portion of the cover 30 in the optical transmission apparatus 1 of the first embodiment has a smaller diameter, compared to the lower portion of the cover 30. Hence, an inner space defined by the retaining member 3 is very small. However, the thermoelectric module 2 of the first embodiment is fixed to the bottom wall 31 in a manner that the projecting portion 211 is oriented to an outer circumference of the bottom wall 31. Accordingly, a portion of the thermoelectric module 2, which is located at a level higher than the projecting portion, is located close to an inner circumference of the bottom wall 31. Therefore, the thermoelectric module 2 of the first embodiment may be readily disposed inside the retaining member 3, i.e., a narrow space. In addition, the size of the optical transmission apparatus 1 of the first embodiment may be reduced.

(Second Embodiment)

Figure 7:
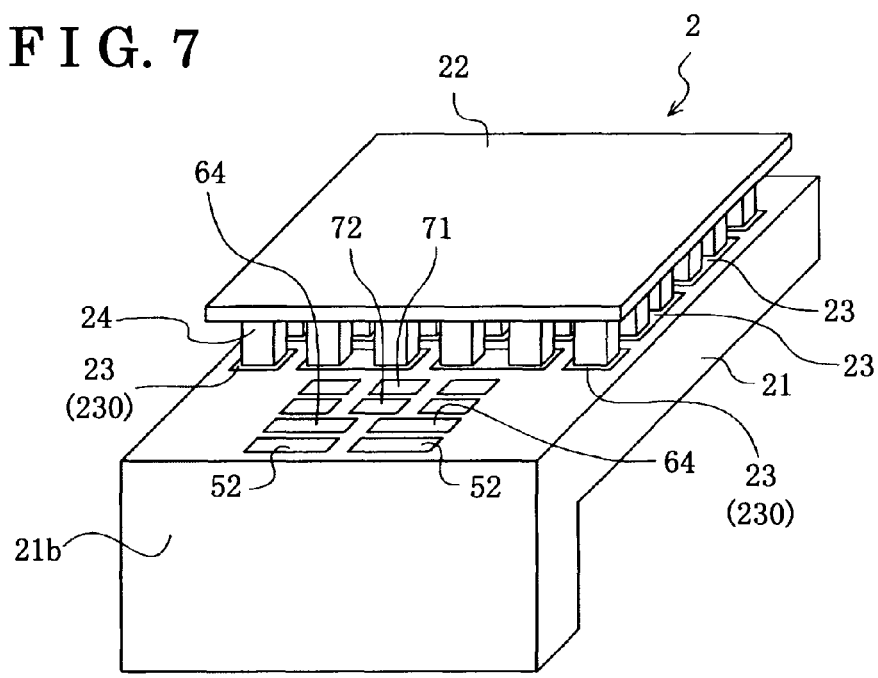
FIG. 7 is a perspective view schematically showing a thermoelectric module according to a second embodiment.
Figure 13:
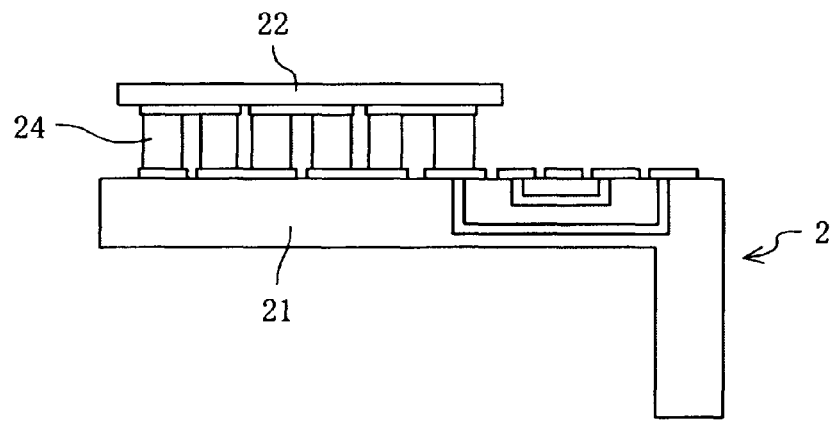
FIG. 13 is an explanation diagram schematically showing the manufacturing process of the thermoelectric module according to the second embodiment.
Figure 14:
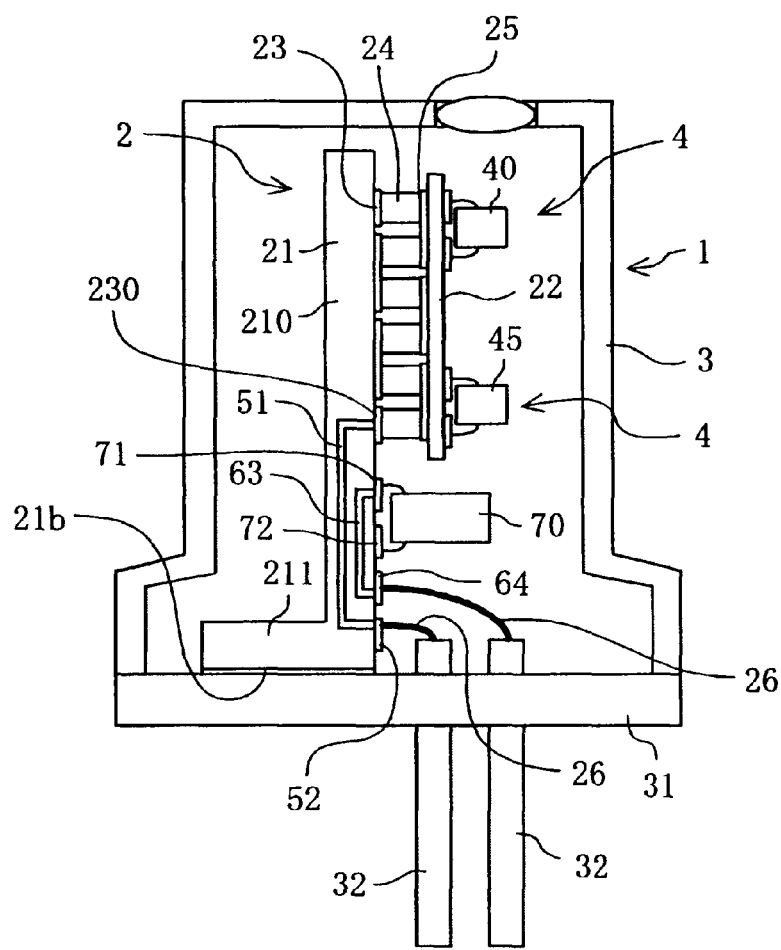
FIG. 14 is an explanation diagram schematically showing a cross section of an optical transmission apparatus according to the second embodiment, cut in an up-and-down direction in FIG. 1.

A thermoelectric module of the second embodiment is one example of the after-mentioned first thermoelectric module having a property that the part of the conducting circuit is formed inside at least one of the first insulated substrate and the second insulated substrate (Property 1). Further, the thermoelectric module of the second embodiment is one example of the after-mentioned second thermoelectric module having another property that the first insulated substrate includes a substrate body having the first opposing surface and a projecting portion being formed continuously from the substrate body, extending in a direction that intersects the substrate body, and forming a fixing surface therein (Property 2). An optical transmission apparatus of the second embodiment is one examples of the invention. FIG. 7 is a perspective view schematically showing the thermoelectric module of the second embodiment. FIGS. 8 to 13 are explanation drawings, each schematically showing manufacturing process of the thermoelectric module of the second embodiment. FIG. 14 is an explanation drawing schematically showing the optical transmission apparatus of the second embodiment cut in the direction corresponding to the up-and-down direction in FIG. 1.

As shown in FIG. 14, the optical transmission apparatus 1 of the second embodiment includes the retaining member 3, the thermoelectric module 2, and the optical transmission device 4. The retaining member 3, which is identical to the one used in the first embodiment, is used here. The optical transmission device 4 includes the light emitting element 40 and the light receiving element 45, which are identical models to those used in the first embodiment.

The second insulated substrate 22, the group of first electrodes for the thermoelectric transducer 23, the group of second electrodes for the thermoelectric transducer 25, and the thermoelectric transducers 24, which are disposed in the thermoelectric module 2, are substantially identical to those used in the first embodiment. The first insulated substrate 21 includes the substrate body 210 and the projecting portion 211, which are similar to those used in the first embodiment. The fixing surface 21b, which is similar to that of the first embodiment, is formed at the projecting portion 211. The fixing surface 21b is fixed on the bottom wall 31 of the retaining member 3. More specifically, the fixing surface 21b is adhered on the bottom wall 31 by means of a thermally conductive adhesive, i.e. an epoxy resin adhesive.

As shown in FIG. 14, two first inner circuits 51, comprising the conducting circuit, and two third inner circuits 63, comprising the third sub conducting circuit, are formed inside the substrate body 210. The group of first electrodes for the thermoelectric transducer 23 and the two electrodes for IC 71 and 72, which are identical to those used in the first embodiment, are formed at the front surface of the substrate body 210. Further, two first electrodes for communication 52 are formed at a side lower than the first electrodes for the thermoelectric transducer 23, i.e. a side of the fixing surface 21b. Two third electrodes for communication 64 are formed at a side lower than the electrodes for IC 71 and 72, i.e. the side of the fixing surface 21b. Two first electrodes for the thermoelectric transducer 230 connect with the two thermoelectric transducers 24, each located at the end with respect to the direction of the alignment thereof, and respectively connect with the first electrodes for communication 52 via the first inner circuit 51. The first electrodes for communication 52 are respectively connected with each lead terminal 32 by means of each bonding wire 26. The bonding wires 26, the first inner circuits 51, and the first electrodes for communication 52 correspond to the conducting circuit in the thermoelectric module of the invention.

The two electrodes for IC 71 and 72 are respectively connected with each third electrode for communication 64 by each third inner circuit 63. Each third electrode for communication 64 is electrically connected with the corresponding lead terminal 32 via each bonding wire 26.

Manufacturing process of the thermoelectric module 2 of the second embodiment will be described below.

(Intermediate Forming Process)

Figure 8:
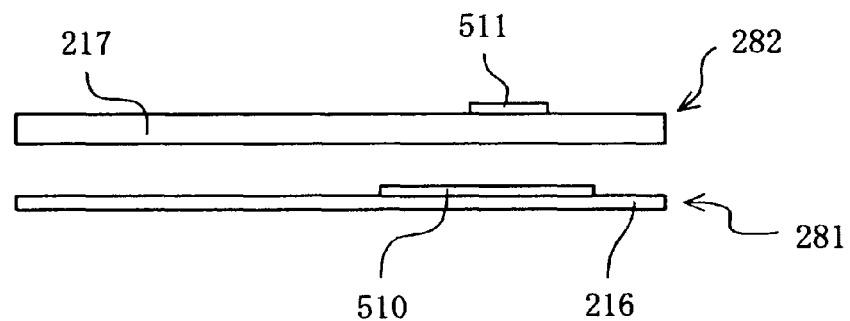
FIG. 8 is an explanation diagram schematically showing manufacturing process of the thermoelectric module according to the second embodiment.

Three thin layers (a first thin layer 216, a second thin layer 217, and a third thin layer 218) and a pillar 219 are molded by using slurry Aluminum oxide based mixed materials. Paste-like copper based mixed materials is printed on an upper layer of the first thin layer 216 to obtain a first thin layer intermediate form 281, formed by layering a first copper layer 510 over the first thin layer 216. Further, the copper base mixed materials are printed in another pattern, which is different from that of the first thin layer intermediate form 281, to obtain a second thin layer intermediate form 282, formed by layering a second copper layer 511 over the second thin layer 217, as shown in FIG. 8. Although not shown in drawings, the first copper layer 510 is formed by two patterns spaced away from each other. Similarly, the second copper layer 511 is formed by two patterns spaced away from each other.

Figure 9:
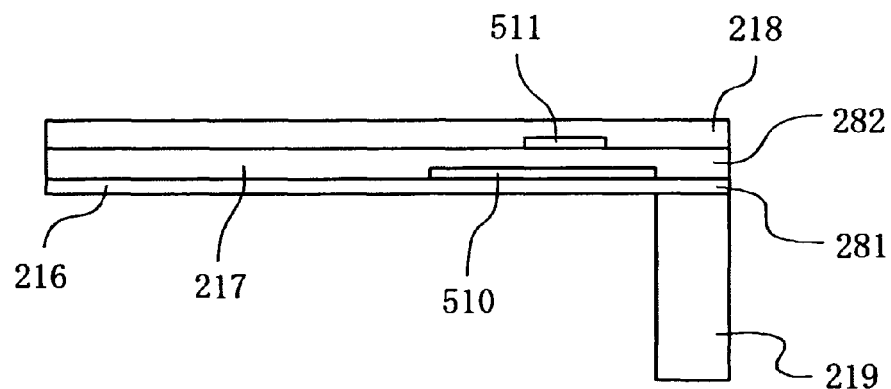
FIG. 9 is an explanation diagram schematically showing the manufacturing process of the thermoelectric module according to the second embodiment.

Subsequently, as shown in FIG. 9, the first thin layer intermediate form 281 is layered over an upper layer of the pillar 219, and the second thin layer intermediate form 282 is layered over an upper layer of the first thin layer intermediate form 281. Further, the third thin layer 218 is layered over the upper layer of the second thin layer intermediate form 282.

Figure 10:
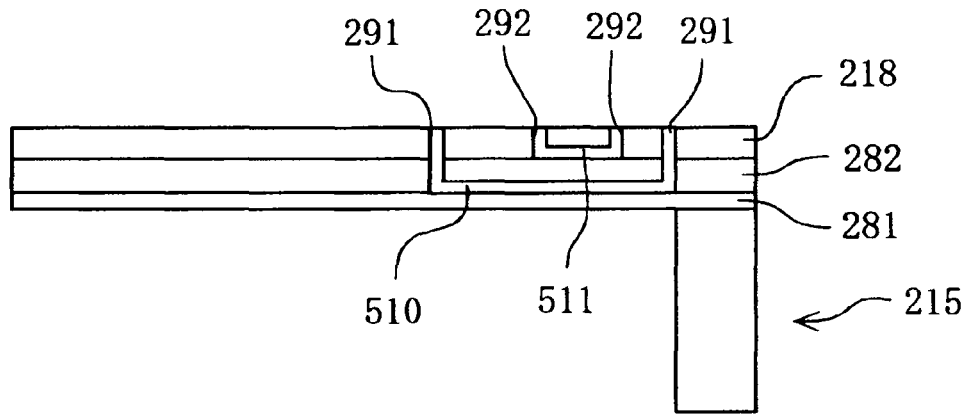
FIG. 10 is an explanation diagram schematically showing the manufacturing process of the thermoelectric module according to the second embodiment.

Then, four communication pores (first communication pores 291), presenting a non-penetrating form, are formed. The pores open at a side of the third thin layer 218 and close at the side of the first thin layer intermediate form 281. Two of the four first connection pores 291 communicate with one pattern of the first copper layer 510. The other two of the first connection pores 291 communicate with the other pattern of the first copper layer 510. Similarly, four communication pores (second communication pores 292), presenting a non-penetrating form, are formed. The pores open at the side of the third thin layer 218 and close at the side of the second thin layer intermediate form 282. Two of the second communication pores 292 communicate with one pattern of the second copper layer 511. The other two of the second communication pores 291 communicate with the other pattern of the second copper layer 511. Each first and second communication pore is filled with the paste like copper based mixed materials. The first insulated substrate intermediate form 215 shown in FIG. 10 is obtained in the above-described processes.

(Electrode Forming Process)

Figure 11:
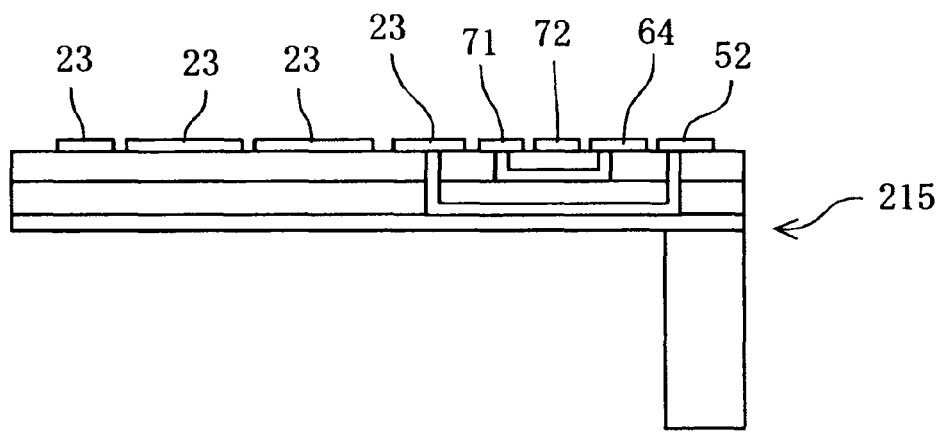
FIG. 11 is an explanation diagram schematically showing the manufacturing process of the thermoelectric module according to the second embodiment.

As shown in FIG. 11, the first electrodes for the thermoelectric transducer 23, the electrodes for IC 71 and 72, the first electrodes for communication 52, and the third electrodes for communication 64 are plated on a front surface of the first insulated substrate intermediate form 215 obtained in the intermediate forming process.

(Baking Process)

Figure 12:
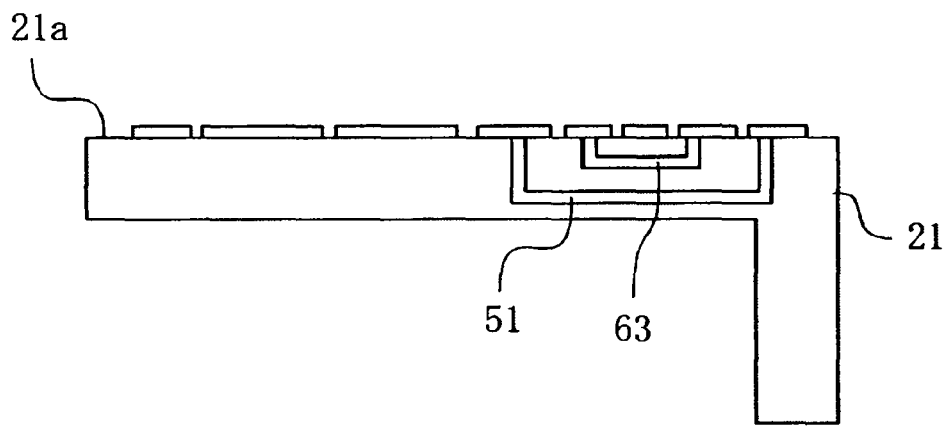
FIG. 12 is an explanation diagram schematically showing the manufacturing process of the thermoelectric module according to the second embodiment.

The first insulated substrate intermediate form 215, on which the aforementioned electrodes are formed, is baked to obtain the first insulated substrate 21 shown in FIG. 12. More specifically, after the baking process, the first, second, third thin layers 216, 217, and 218 are secured to one another to be integrated into the first insulated substrate 21. Further, after the baking process, one pattern of the first copper layer 510 is secured with the copper based mixed materials filled into the two first communication pores 291 to be integrated for obtaining one first inner circuit 51. Similarly, the other pattern of the first copper layer 510 is secured with the copper based mixed materials filled into the other two first communication pores 291 to be integrated for obtaining the other first inner circuit 51. Similarly, one pattern of the second copper layer 511 is secured with the copper based mixed materials filled into the two second communication pores 292 to be integrated for obtaining one third inner circuit 63. Similarly, the other pattern of the second copper layer 511 is secured with the copper based mixed materials filled into the other two second communication pores 292 to be integrated for obtaining the other third inner circuit 63.

The thermoelectric transducers 24 and the second insulated substrate 22 are fixed on the first insulated substrate 21 obtained by the above-described process in a similar method adopted in the first embodiment. Then, the thermoelectric module 2 of the second embodiment is obtained as shown in FIGS. 7 and 13.

As with the thermoelectric module of the first embodiment, the thermoelectric modules 2 of the second embodiment may be disposed at the limited space, and has the excellent heat exchange ability. Moreover, as with the optical transmission apparatus of the first embodiment, the optical transmission apparatus 1 of the second embodiment may effectively cool the light emitting element 40 by means of the thermoelectric module 2, leading to the size reduction of the optical transmission apparatus.

Further, in the thermoelectric module 2 of the second embodiment, the part of the conducting circuits (first inner circuit 51) and the part of the third sub conducting circuits (third inner circuit 63) are formed inside the first insulated substrate 21. Hence, the region of the first opposing surface 21a, on which the thermoelectric transducers 24 are disposed, may be further enlarged. Therefore, the thermoelectric module 2 of the second embodiment has the excellent heat exchange ability.

Further, the first electrodes for communication 52 are formed closer to the fixing surface 21b, compared to the first electrodes for thermoelectric transducer 23. Consequently, the distance between each first electrode for communication 52 and the lead terminal 32 is short. Thus, the configuration simplifies operation for connecting each first electrode for communication 52 with the lead terminal 32 via the bonding wire 26. Similarly, the third electrodes for communication 64 are formed closer to the fixing surface 21b, compared to the electrodes for IC 71 and 72. Consequently, the distance between each third electrode for communication 64 and the lead terminal 32 is short. Thus, the configuration simplifies operation for connecting each third electrode for communication 64 with the lead terminal 32 via the bonding wire 26. Namely, the operation for connecting the thermoelectric module 2 with the external power source is effectively conducted in the thermoelectric module 2 of the second embodiment.

Instead of the paste like copper base materials used in the second embodiment, another paste like material, comprised of other metals, may be used. For example, copper may be replaced with tungsten, titanium, molybdenum and the like.

(Third Embodiment)

Figure 15:
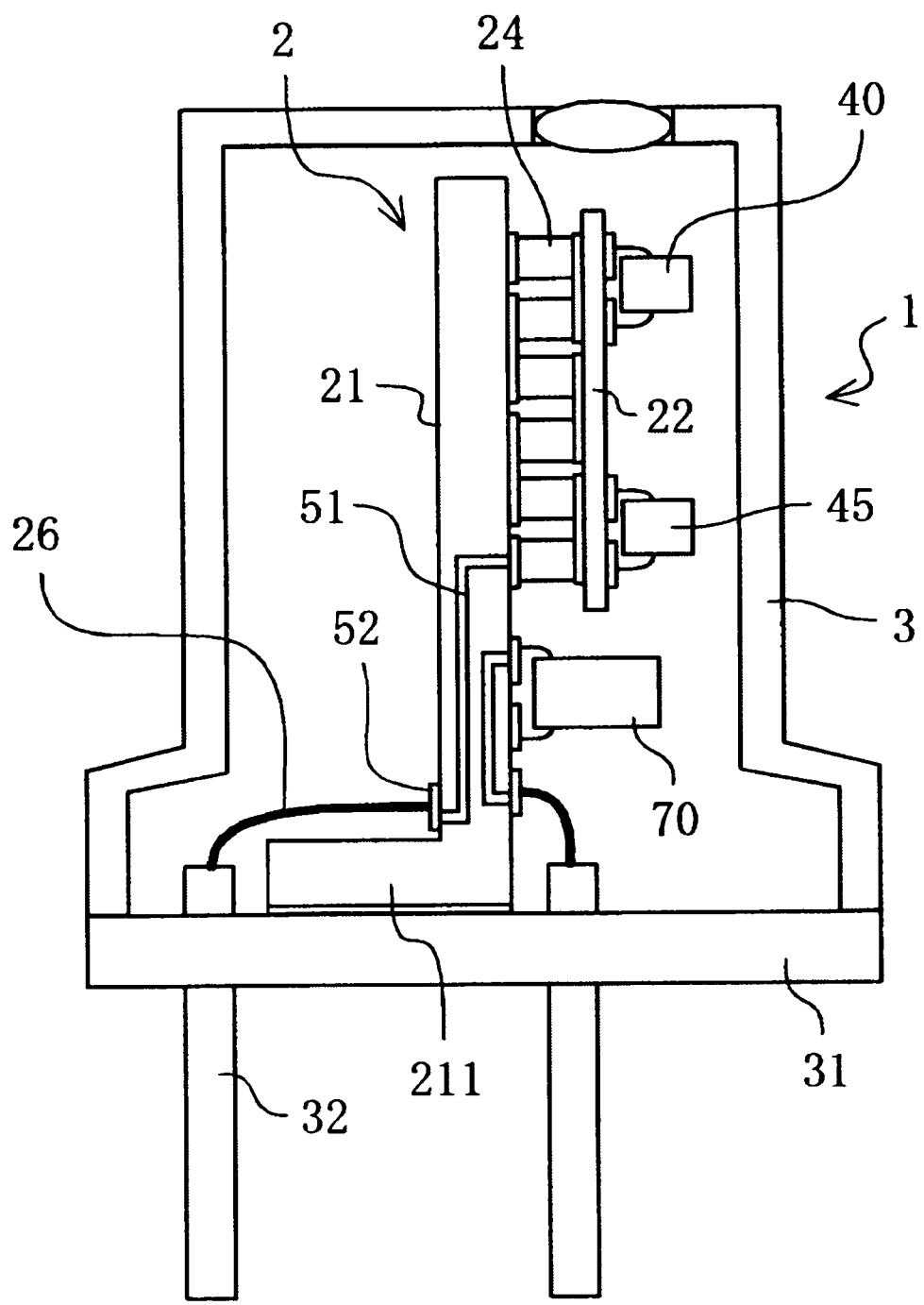
FIG. 15 is an explanation diagram schematically showing a cross section of an optical transmission apparatus according to a third embodiment, cut in the up-and-down direction in FIG. 1.

The thermoelectric module of a third embodiment is identical to the thermoelectric module of the second embodiment except the form of the first inner circuit and the position of the first electrodes for communication. An optical transmission apparatus of the third embodiment is identical to the optical transmission apparatus of the second embodiment except the form of the first inner circuit and the position of the first electrodes for communication, and the position of the lead terminals. FIG. 15 is an explanation diagram schematically showing the optical transmission apparatus of the third embodiment cut in the direction corresponding to the up-and-down direction in FIG. 1.

As shown in FIG. 15, in the thermoelectric module 2 of the third embodiment, the first electrodes for communication 52 are formed at the rear surface of the first insulated substrate 21. Further, one end portion of each first inner circuit 51 extends towards the rear surface of the first insulated substrate 21. The two lead terminals 32 are disposed closer to the outer circumferential of the retaining member 3, compared to the projecting portion 211. Each lead terminal 32 is electrically connected with the corresponding first electrode for communication 52 via the bonding wire 26.

As with the thermoelectric module of the second embodiment, the thermoelectric module 2 of the third embodiment may be disposed at the limited space and has the excellent heat exchange ability. Further, the thermoelectric module enhances the efficiency of the operation for connecting the module with the external power source. Furthermore, as with the optical transmission apparatus of the second embodiment, the optical transmission apparatus 1 of the third embodiment effectively cools the light emitting element 4 by means of the thermoelectric module 2, leading to size reduction of the optical transmission apparatus 1.

(Fourth Embodiment)

Figure 16:
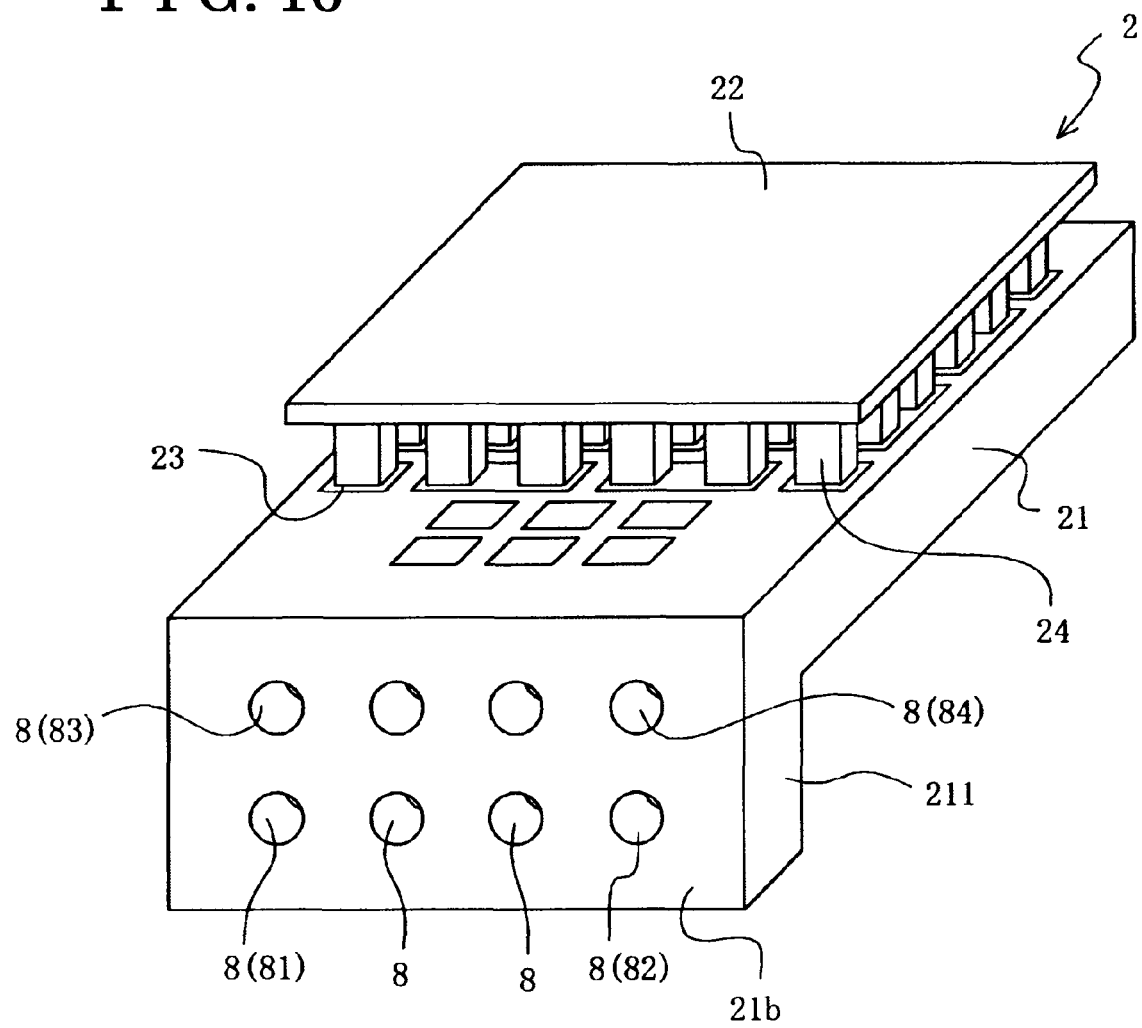
FIG. 16 is a perspective view schematically showing a thermoelectric module according to a fourth embodiment.
Figure 17:
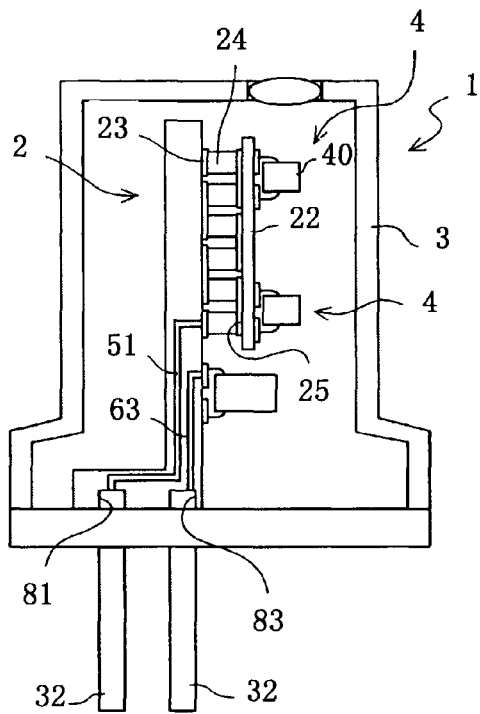
FIG. 17 is an explanation diagram schematically showing a cross section of an optical transmission apparatus according to the fourth embodiment, cut in the up-and-down direction in FIG. 1.

The thermoelectric module of a four embodiment is one example of the after-mentioned first thermoelectric module having Properties 3 and 4 as well as Property 1. At least one of the first and second insulated substrates of the thermoelectric module has a multi-layered structure (Property 3). The multi-layered structure is comprised of the body layer made up of the metal materials and the insulated layer made up of the insulated materials, and the insulated layer is formed on the surface of the body layer. At least one of the first and second insulated substrates of the thermoelectric module has poriform connecting portions whose inside is in communication with the conducting circuit (Property 4). Further, the second thermoelectric module of the fourth embodiment is one example of the second thermoelectric module having Properties 2, 3 and 4. The optical transmission apparatus of the fourth embodiment is one example of the optical transmission apparatus of the invention. FIG. 16 is a perspective view schematically showing the thermoelectric module of the fourth embodiment. FIG. 17 is an explanation diagram schematically showing the optical transmission apparatus 1 of the fourth embodiment cut in the direction corresponding to the up-and-down direction in FIG. 1.

As shown in FIG. 17, the optical transmission apparatus 1 of the fourth embodiment includes the retaining member 3, the thermoelectric module 2, and the optical transmission device 4. The retaining member 3 is identical to that of the first embodiment except the inserting position of the lead terminals 32.

In the thermoelectric module 2, the second insulated substrate 22, the group of first electrodes for thermoelectric transducer 23, the group of second electrodes for thermoelectric transducer 25, and the thermoelectric transducers 24 are substantially identical to those used in the second embodiment. As shown in FIG. 16, the first insulated substrate 21 has multiple connecting portions 8. Each connecting portion 8 forms a pore which does not penetrate and extends from the rear surface 21b of the projecting portion 211 toward an upper surface thereof. An inside of an first connecting portion 81, which is one of the connecting portions 8, is in communication with the one first inner circuit 51. An inside of a second connecting portion 82, which is another one of the connecting portions 8, is in communication with the other first inner circuit 51. An inside of a third connecting portion 83, which is another one of the connecting portions 8, is in communication with the one third inner circuit 63. An inside of a fourth connecting portion 84, which is another one of the connecting portions 8, is in communication with the other third inner circuit 63.

The conducting circuit in the thermoelectric module 2 of the fourth embodiment may be connected with the external power source by inserting the corresponding lead terminals 32 into the first and second connecting portions 81 and 82. Further, the third sub conductivity circuit in the thermoelectric module 2 of the fourth embodiment may be connected with the external power source by inserting the corresponding lead terminals 32 into the third and fourth connecting portions 83 and 84. Therefore, the thermoelectric module 2 of the fourth embodiment enhances the efficiency of the operation for connecting with the external power source.

Further, the number of the bonding wires 26 may be reduced in the thermoelectric module 2 of the fourth embodiment. Hence, the large region of the first opposing surface 21a, on which the thermoelectric transducers 24 are disposed, is secured in the thermoelectric module 2 of the fourth embodiment. Therefore, the thermoelectric module 2 of the fourth embodiment has the excellent heat exchange ability.

Furthermore, as with the thermoelectric module of the second embodiment, the thermoelectric module 2 of the fourth embodiment may be disposed at the limited space. Furthermore, as with the optical transmission apparatus of the second embodiment, the optical transmission apparatus 1 of the fourth embodiment effectively cools the light emitting element 40 by means of the thermoelectric module 2, leading to the size reduction of the optical transmission apparatus. The optical transmission apparatus 1 of the embodiments 1 to 4 includes the box shape retaining member 3, the thermoelectric module 2 retained inside the retaining member 3 and the optical transmission device 4 having the light emitting element 40 and retained inside the retained member 3. It is desirable that the fixing surface 21b is fixed at the inner bottom surface of the retaining member 3.

According to the above-described embodiment, the first thermoelectric module is characterized by including the first insulated substrate 21 having the first opposing surface 21a, the second insulated substrate 22 having the second opposing surface 22c which faces the first opposing surface 21a, the plurality of electrodes 23 and 25 formed at the first and second opposing surfaces 21a and 22c, the plurality of thermoelectric transducers 24 provided between the first insulated substrate 21 and the second insulated substrate 22 and electrically connected with one another in series or in parallel via each electrode 23, 25, and the conducting circuit connecting the plurality of electrodes 23, 25 with the external power source. The first insulated substrate 21 includes the substrate body 210 having the first opposing surface 21a and the projecting portion 211 being formed continuously from the substrate body 210 and extending in the direction that intersects the substrate body 210. The projecting portion 211 includes the fixing surface 21b extending in the direction that intersects the substrate body 210.

It is desirable that the first thermoelectric module has Property 1.

According to the above-described embodiment, the second thermoelectric module is characterized by including the first insulated substrate 21 having the first opposing surface 21a, the second insulated substrate 22 having the second opposing surface 22c which faces the first opposing surface 21a, the plurality of electrodes 23 and 25 formed at the first and second opposing surfaces 21a and 22c, the plurality of thermoelectric transducers 24 provided between the first insulated substrate 21 and the second insulated substrate 22 and electrically connected with one another in series or in parallel by each electrode 23, 25, and the conducting circuit connecting the plurality of electrodes 23 and 25 with the external power source. The first insulated substrate 21 includes the fixing surface 21b extending in the direction that intersects the first opposing surface 21a and the part of the conducting circuit is formed inside the first insulated substrate 21.

It is desirable that the second thermoelectric module has Property 2.

The first and second thermoelectric modules have one of Property 3 and Property 4.

According to the above-described embodiment, the third thermoelectric module is characterized by including the first insulated substrate 21 having the first opposing surface 21a, the second insulated substrate 22 having the second opposing surface 22c which faces the first opposing surface 21a, the plurality of electrodes 23 and 25 formed at the first and second opposing surfaces 21a and 22c, the plurality of thermoelectric transducers 24 provided between the first insulated substrate 21 and the second insulated substrate 22 and electrically connected with one another in serial or connected in parallel via each electrode 23, 25, and the conducting circuit connecting the plurality of electrodes 23 and 25 with the external power source. The first insulated substrate 21 includes the fixing surface 21b extending in the direction that intersects the first opposing surface 21a.

According to the above-described embodiment, the optical transmission apparatus 1 is characterized by including the box shape retaining member 3, the thermoelectric module 2 retained in the retaining member 3, the optical transmission device 4 having the light emitting element 40 and being retained in the retaining member 3. The fixing surface 21b of the first insulated substrate 21 is fixed on the inner bottom of the retaining member 3.

Figure 18:
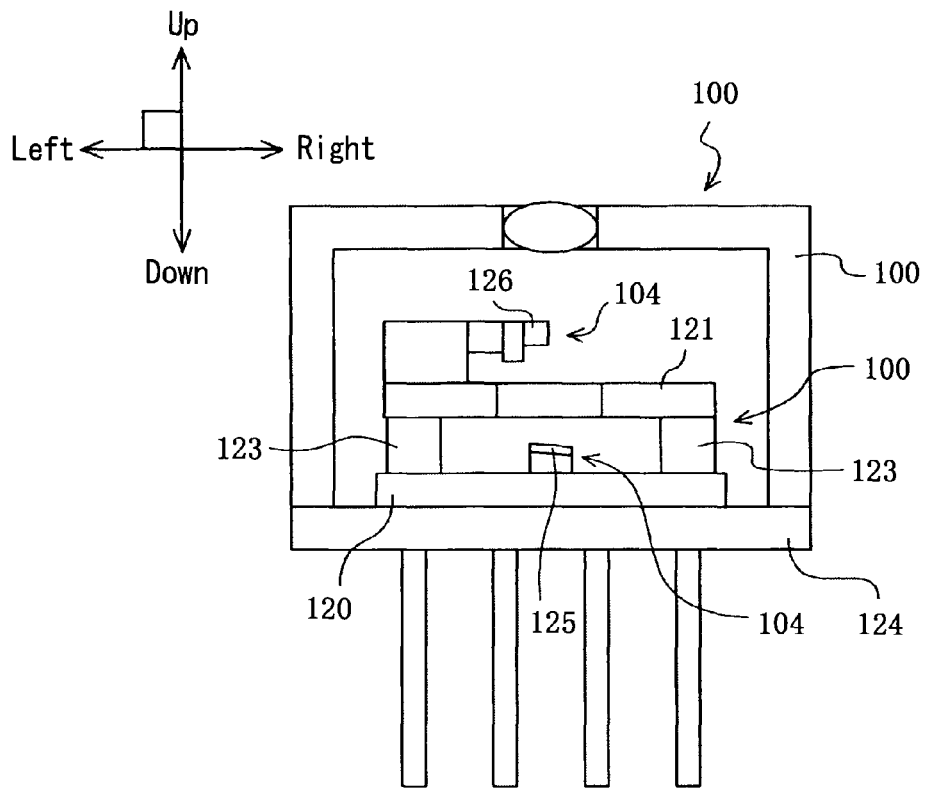
FIG. 18 is an explanation drawing schematically showing a known optical transmission apparatus.

The first insulated substrate 21 in the first thermoelectric module has the fixing surface 21b extending in the direction that intersects the first opposing surface 21a. The fixing surface 21b of the first insulated substrate 21 is fixed to the retaining member 3 such as the one shown in FIG. 18, and the configuration allows the first insulated substrate 21 to enlarge the first opposing surface 21a, i.e. the region where the thermoelectric transducers 24 are disposed, so as to be larger than the bottom wall of the retaining member 3. Hence, the first thermoelectric module 2 may be disposed at the limited space and the greater number of the thermoelectric transducers 24 may be disposed. Increase in the number of the thermoelectric transducers 24 improves the thermoelectric module 2 in terms of the heat exchange ability. Therefore, the first thermoelectric module may be disposed at the limited space and has the excellent heat exchange ability.

Furthermore, forming the fixing surface 21b at the projecting portion 211 allows the first insulated substrate 21 to secure a large space for fixing even if the thickness of the first insulated substrate 21 is not increased so much. The large fixing surface transmits the heat generated in the thermoelectric transducers 24 to the retaining member 3 more effectively, and various kinds of apparatuses are effectively cooled or heated by means of the thermoelectric transducers 24. Therefore, the first thermoelectric module has the excellent heat exchange ability. In addition, if the fixing surface is large, the thermoelectric module 2 is securely fixed to the retaining member 3.

In the first thermoelectric module having Property 1, the part of the electric circuit provided at the first insulated substrate 21 is formed inside the first insulated substrate 21 and/or the second insulated substrate 22. This configuration allows the first insulated substrate 21 to enlarge the region, in which the thermoelectric transducers 24 are disposed, in the first opposing surface 21a. Hence, the greater number of the thermoelectric transducers 24 are disposed at the first thermoelectric module. In other words, the first thermoelectric module having Property 1 has the excellent heat exchange ability. Moreover, the above-described configuration allows components such as an IC to be directly disposed at or connected with the first and second insulated substrates 21 and 22. Therefore, the configuration improves efficiency of the mounting operation.

As with the first insulated substrate 21 in the first thermoelectric module, the first insulated substrate 21 in the second thermoelectric module has the fixing surface 21b extending in the direction that intersects the first opposing surface 21a. Thus, the second thermoelectric module is disposed at the limited space and has the excellent heat exchange ability.

Further, the part of the electric circuit provided at the first insulated substrate 21 is formed inside the first insulated substrate 21. The configuration allows the first insulated substrate 21 to enlarge the region, in which the thermoelectric transducers 24 are disposed, in the first opposing surface 21a. Therefore, the greater number of the thermoelectric transducers 24 may be disposed at the second thermoelectric module, and the second thermoelectric module has the excellent heat exchange ability.

As with the first thermoelectric module, the fixing surface 21b is formed at the projecting portion 211 in the second thermoelectric module having Property 2. This configuration enables the second thermoelectric module having Property 2 to form the larger fixing surface even if the size of the first insulated substrate 21 is not increased so much. Therefore, the second thermoelectric module having Property 2 has the excellent heat exchange ability and may be securely fixed to the retaining member 3.

In the first and second thermoelectric modules having Property 3, the first insulated substrate 21 and/or the second insulated substrate 22 has the body layer made up of the metal materials. The body layer made up of the metal materials may be molded readily. Hence, the first and second thermoelectric modules having Property 3 are produced readily. Further, the body layer made up of the metal materials is excellent in thermal conductivity. Thus, the heat generated in the thermoelectric transducers 24 is effectively transmitted to the retaining member 3 due to the meal body layer. Therefore, the first and second thermoelectric modules having Property 3 has the excellent heat exchange ability.

In the first and second thermoelectric modules having Property 4, the conducting circuit of the thermoelectric module 2 is readily connected to the external power source by inserting the lead terminals 32 into the corresponding connecting portion 8. Thus, this configuration enables the operation for connecting the conducting circuit with the external power source to be conducted efficiently in the first and second thermoelectric modules having Property 4.

As with the first insulated substrates in the first and second thermoelectric modules, the first insulated substrate in the third thermoelectric module has the fixing surface 21b extending in the direction that intersects the first opposing surface 21a. Thus, the third thermoelectric module may be disposed at the limited space and has the excellent heat exchange ability. The third thermoelectric module should have any one of Properties 2 to 4.

Each optical transmission apparatus 1 according to the above-described embodiments has the excellent heat exchange ability due to the aforementioned thermoelectric modules 2.

The principles, of the preferred embodiments and mode of operation of the present invention have been described in the foregoing specification. However, the invention, which is intended to be protected, is not to be construed as limited to the particular embodiment disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents that fall within the spirit and scope of the present invention as defined in the claims, be embraced thereby.

The invention claimed is:

1. An optical transmission apparatus comprising:
a retaining member including a bottom wall;
a thermoelectric module accommodated in the retaining member,
the thermoelectric module including a first insulated substrate having a first opposing surface, a second insulated substrate having a second opposing surface, the second opposing surface faces the first opposing surface, a plurality of electrodes formed on the first and second opposing surfaces, a plurality of thermoelectric transducers provided between the first insulated substrate and the second insulated substrate, the plurality of thermoelectric transducers electrically connected with one another in series and/or in parallel via each electrode, and a conducting circuit electrically connecting the plurality of electrodes with an external power source; and
an optical transmission device accommodated in the retaining member,
wherein the first insulated substrate includes a substrate body having the first opposing surface and a portion being continuously extended from the substrate body parallel to the substrate body and an insulated projecting portion continuously extending from the portion in a direction that the first and second opposing surfaces face each other,
the portion which is not covered with the second insulated substrate,
the insulated projecting portion includes a fixing surface extending in the direction that the first and second opposing surfaces face each other,
the projecting portion has a poriform connecting portion opening at the fixing surface,
an inside of the poriform connecting portion is in communication with the conducting circuit,
a lead terminal is inserted into the corresponding connecting portion, and
the fixing surface is fixed to the bottom wall of the retaining member.

2. The optical transmission apparatus according to claim 1, wherein the optical transmission device is mounted on the second insulated substrate that is cooled by the thermoelectric module.

3. The optical transmission apparatus according to claim 2, wherein at least one of the first insulated substrate and the second insulated substrate has a multi-layered structure, which is formed by a body layer made up of a metal material and an insulated layer formed on a surface of the body layer, the insulated layer made up of an insulated material.

4. The optical transmission apparatus according to claim 3, wherein the first insulated substrate is of an L-shaped structure.

5. The optical transmission apparatus according to claim 4, wherein the first insulated and second substrates are in a form of outermost-located members, respectively.

* * * * *